(12) United States Patent
Lautzenhiser et al.

(10) Patent No.: US 9,050,628 B2
(45) Date of Patent: Jun. 9, 2015

(54) PULSE-ECHO ACOUSTIC TRANSDUCER

(71) Applicants: Frans Lautzenhiser, Zionsville, IN (US); Mahesh Matam, Zionsville, IN (US)

(72) Inventors: Frans Lautzenhiser, Zionsville, IN (US); Mahesh Matam, Zionsville, IN (US)

(73) Assignee: Piezotech LLC, Indianapolis, IN (US)

( * ) Notice: Subject to any disclaimer, the term of this patent is extended or adjusted under 35 U.S.C. 154(b) by 361 days.

(21) Appl. No.: 13/753,654

(22) Filed: Jan. 30, 2013

(65) Prior Publication Data

US 2014/0062259 A1    Mar. 6, 2014

Related U.S. Application Data

(60) Provisional application No. 61/592,294, filed on Jan. 30, 2012.

(51) Int. Cl.

| | |
|---|---|
| *H01L 41/08* | (2006.01) |
| *B06B 1/06* | (2006.01) |
| *H01L 41/113* | (2006.01) |
| *H01L 41/187* | (2006.01) |
| *E21B 47/10* | (2012.01) |
| *H04R 17/02* | (2006.01) |

(52) U.S. Cl.
CPC .......... *B06B 1/0644* (2013.01); *H01L 41/1132* (2013.01); *H01L 41/1875* (2013.01); *B06B 1/067* (2013.01); *B06B 1/0677* (2013.01); *E21B 47/101* (2013.01); *H04R 17/025* (2013.01)

(58) Field of Classification Search
USPC .......... 310/335, 334, 326, 327, 348; 181/104, 181/105; 367/35
IPC .................. H04R 17/00; B06B 1/067
See application file for complete search history.

(56) References Cited

U.S. PATENT DOCUMENTS

| | | | | |
|---|---|---|---|---|
| 4,184,094 A | * | 1/1980 | Kopel | 310/335 |
| 4,297,607 A | | 10/1981 | Lynnworth et al. | |
| 4,507,582 A | | 3/1985 | Glenn | |
| 4,963,782 A | * | 10/1990 | Bui et al. | 310/334 |
| 5,044,462 A | * | 9/1991 | Maki, Jr. | 181/103 |
| 5,130,950 A | * | 7/1992 | Orban et al. | 367/34 |

(Continued)

FOREIGN PATENT DOCUMENTS

| | | |
|---|---|---|
| CN | 101524682 A | 9/2009 |
| CN | 201516405 U | 6/2010 |

(Continued)

*Primary Examiner* — Thomas Dougherty
*Assistant Examiner* — Karen B Addison
(74) *Attorney, Agent, or Firm* — Overhauser Law Offices LLC

(57) ABSTRACT

A piezoceramic pulse-echo acoustic transducer includes protection layers for the piezoceramic that are tuned to the piezoceramic so as to optimize pulse-echo signal response (i.e. greater output signal bandwidth and increased return signal sensitivity). The protection layers are tuned to the piezoceramic via material selection and thickness. The acoustic transducer has a backing, a piezoceramic adjacent the backing, an intermediate protection layer adjacent the piezoceramic, and a front protection layer adjacent the intermediate protection layer and opposite the piezoceramic. The front and intermediate protection layers are tuned to the piezoceramic via their acoustic impedance such that the acoustic impedance of the intermediate layer is greater than the acoustic impedance of the piezoceramic and of the front protection layer. The acoustic impedance of the front protection layer is less than the acoustic impedance of the piezoceramic.

13 Claims, 8 Drawing Sheets

(56) References Cited

U.S. PATENT DOCUMENTS

| | | |
|---|---|---|
| 5,486,734 A | 1/1996 | Seyed-Bolorforosh |
| 5,553,035 A | 9/1996 | Seyed-Bolorforosh et al. |
| 6,049,159 A | 4/2000 | Barthe et al. |
| 6,307,302 B1 | 10/2001 | Toda |
| 6,353,277 B1 | 3/2002 | Hahn-Jose |
| 6,406,433 B1 | 6/2002 | Mamayek |
| 6,989,625 B2 | 1/2006 | Suzuki et al. |
| 7,389,569 B2 | 6/2008 | Shiraishi et al. |
| 7,439,656 B2 | 10/2008 | Ossmann |
| 7,513,147 B2 * | 4/2009 | Yogeswaren ............ 310/334 |
| 8,129,886 B2 | 3/2012 | Zhao et al. |
| 8,264,126 B2 | 9/2012 | Toda et al. |
| 8,408,355 B2 * | 4/2013 | Pabon et al. ............ 181/104 |
| 2004/0095847 A1 | 5/2004 | Hassan et al. |
| 2005/0000279 A1 | 1/2005 | Yogeswaren |
| 2005/0002276 A1 | 1/2005 | Yogeswaren |
| 2012/0163126 A1 | 6/2012 | Campbell et al. |

FOREIGN PATENT DOCUMENTS

| | | |
|---|---|---|
| EP | 0039986 B1 | 4/1983 |
| JP | 08-213870 A | 8/1996 |
| JP | 2003-259490 A | 9/2003 |
| JP | 2006-101204 A | 4/2006 |
| WO | 2012/112137 A1 | 8/2012 |

* cited by examiner

PULSE-ECHO ACOUSTIC TRANSDUCER

CROSS-REFERENCE TO RELATED APPLICATIONS

This US non-provisional patent application claims the benefit of and priority to U.S. provisional patent application Ser. No. 61/592,294 filed Jan. 30, 2012 entitled "Logging While Drilling Pulse-Echo Transducer", the entire contents of which is specifically incorporated herein by reference.

FIELD OF THE INVENTION

The present invention relates to the field of acoustic transducers and, more particularly, to pulse-echo acoustic transducers. Such transducers can be employed, for example, in logging-while-drilling operations.

BACKGROUND

When forming a well, such as an oil or natural gas well, a hole is drilled in the earth using an earth-penetrating drill bit situated at an end of one or more drilling tools which, in turn, are disposed at the end of numerous sections of pipe (i.e. a drilling assembly). The drilling assembly is then rotated to affect the drilling process. During or after the drilling process, it is advantageous to gather data and/or take measurements of the well being formed. The one or more drilling tools may include components that allow gathering of data and/or obtaining measurements regarding the well being drilled, the drilling tools being known generally as logging while drilling tools. Alternatively, such tools may be raised or lowered into a previously-drilled well to obtain data or measurements regarding the well.

The drill bit of the drilling assembly has a diameter larger than that of the drilling tools and pipe sections, so that when the drilling assembly bores into the earth, drilled earth can exit the hole from around the drilling assembly. To facilitate drilling and removal of the drilled earth from the hole, a drilling fluid (termed mud) is pumped through the drill bit during drilling. The mud mixes with the drilled earth as it flows through and exits the hole. As such, the mud includes dirt, rocks and other debris. The debris laden mud flows upward through the hole while the drilling assembly rotates during the drilling process. The components of the tools are thus constantly subjected to the damaging effects of debris hitting and abrading the components as a result of the flow of the debris-laden mud during the drilling process.

Tool components for well drilling need to be as rugged or robust as possible. One component typically used in well drilling tools is a pulse-echo acoustic transducer. Such transducers generate an acoustic pulse, which is reflected off the wall of the well, and returned to the transducer. By measuring the amount of time it takes for the reflected pulse to return to the transducer, and by analyzing other characteristics of the pulse, data about the well, such as the distance from the transducer to the well, can be determined. The signal and/or data derived from the signal is logged, often during the drilling process. Alternatively, transducers can be put into pre-drilled well bores to obtain data regarding the well.

Acoustic transducers may include a piezoelectric element mounted to a backing that is retained in a housing which is formed of a polymer such as PEEK (polyetheretherketone). For drilling applications, the housing is mounted in the drilling tool such that a face of the housing adjacent the piezoelectric element is exterior of the drilling tool. The exposed PEEK face is thus constantly subjected to the debris-laden mud flow during the drilling process, which can damage the face and cause it alter its acoustic properties over time, or to completely malfunction. An approach to address this issue could be to make the face thicker since a thicker face can inherently withstand more abrasion. However, it was determined that making a thicker face degrades the acoustic properties of the transmitted acoustic pulse and the received acoustic echo. Therefore, merely making the face of a pulse-echo acoustic transducer thicker does not create a more robust transducer.

Tests conducted by the inventors on pulse-echo piezoelectric acoustic transducers having PEEK faces of 0.100 inches (0.100") thick and 0.300 inches (0.300") thick exhibited undesirable qualities. Particularly, each thickness produced an acoustic signal with limited, bandwidth and exhibiting excessive ringdown.

While the forgoing has been described with reference to pulse-echo acoustic transducers used in drilling operations, and logging while drilling applications in particular, the same problems exist for pulse-echo acoustic transducers used in medical and other applications.

SUMMARY OF THE INVENTION

Disclosed herein is a pulse-echo acoustic transducer having protection layers for a piezoceramic of the transducer that are tuned to the piezoceramic through their acoustic impedance so as to optimize pulse-echo signal response of the transducer. The protection layers are tuned to the piezoceramic via material selection and thickness such that a protection layer between the piezoceramic and an outer protection layer has an acoustic impedance that is greater than the acoustic impedance of the piezoceramic and of the outer protection layer. In this manner, the pulse-echo, acoustic transducer exhibits greater output signal (pulse) bandwidth and increased return signal (echo) sensitivity.

In one form, the acoustic transducer has a backing, a piezoceramic adjacent the backing, an intermediate protection layer adjacent the piezoceramic, and a front protection layer adjacent the intermediate protection layer and opposite the piezoceramic. The acoustic impedance of the intermediate protection layer is greater than the acoustic impedance of the piezoceramic and of the front protection layer. The acoustic impedance of the front protection layer is preferably, but not necessarily, less than the acoustic impedance of the piezoceramic.

Using this acoustic impedance relationship, response of the transducer is exhibits greater output signal (pulse) bandwidth and increased return signal (echo) sensitivity.

In a specific form, the piezoceramic comprises lead metaniobate, the intermediate protection layer comprises titanium, and the front protection layer comprises PEEK. Also, the piezoceramic may comprise a single piezoelectric element or may comprise two or more piezoelectric elements.

The pulse-echo transducer may be used in a variety of applications, including medical, remote sensing, and wells for recovering fossil fuels. When the transducer is used in harsh environments, such as oil wells, it may be situated in an oil-filled, pressure compensated housing.

BRIEF DESCRIPTION OF THE DRAWINGS

Like reference numbers indicate the same or similar parts throughout the several figures.

DETAILED DESCRIPTION

Figure 1:
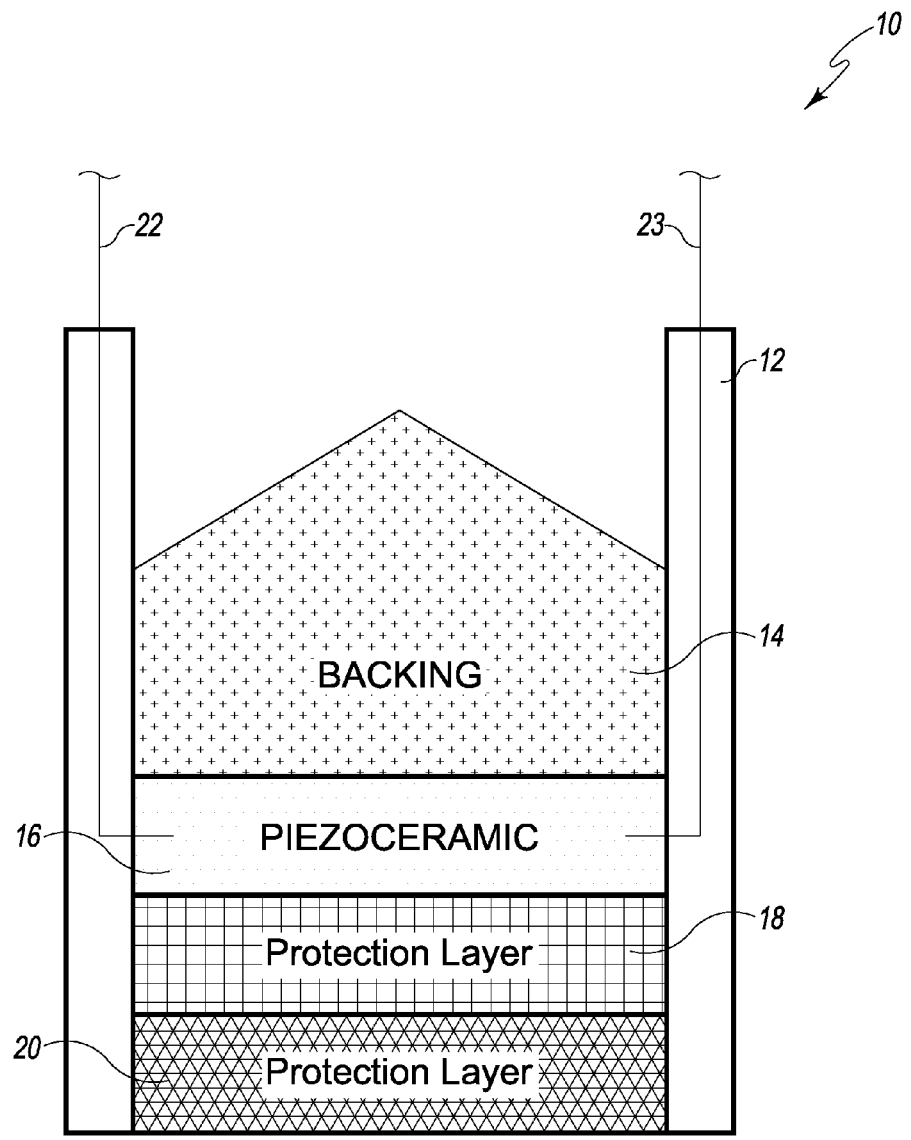
FIG. 1 is an illustration of a general embodiment of a pulse-echo acoustic transducer having protection layers for the piezoelectric element in accordance with the present principles.

Referring to FIG. 1, there is depicted a general illustration of an improved pulse-echo acoustic transducer ("acoustic transducer"), generally designated 10, fashioned in accordance with the present principles, and particularly a pulse-echo acoustic transducer having protection layers for the piezoelectric element of the pulse-echo acoustic transducer. The acoustic transducer 10 includes a housing that is preferably, but not necessarily, formed of polyetheretherketone (PEEK). The PEEK is preferably, but not necessarily, a 30% glass fiber PEEK (30 GF PEEK), 30 GF PEEK provides good abrasion resistance while softening less at higher temperatures than pure PEEK along with other desirable characteristics. However, other types and/or forms of PEEK may be used.

Within the housing 12 is a backing 14 formed of a high acoustic impedance material such as tungsten (having an acoustic impedance of ~80 MRayls) or of a mixture of high acoustic impedance materials (e.g. an epoxy/polymer of ~20 MRayls mixed with powdered tungsten). Of course, other high acoustic impedance materials and/or mixtures may be used. Situated adjacent a face of the backing 14 is a piezoelectric element labeled as a piezoceramic or piezoceramic element (collectively, piezoceramic) 16. A first electrical lead 22 is connected to one side or area of the piezoceramic 16 while a second electrical lead 23 is connected to another side or area of the piezoceramic 16, the nomenclature first and second being arbitrary. The first and second electrical leads 22, 23 are connectable to a suitable voltage source (not shown) and an input/measurement device (not shown). The piezoceramic 16 may be any type of piezoceramic material but is preferably, but not necessarily, a modified lead metaniobate such as those known as K81 and K91, available from, for example, Piezotech, LLC of Indianapolis, Ind., USA. The acoustic impedance of the piezoceramic 16 is around 19 MRayls.

Further within the housing 12 and situated over a face of the piezoceramic 16 opposite the backing 14 is a first protection layer 18 for the piezoceramic 16. The first protection layer 18 is formed of a small thickness material that resists abrasion and has an acoustic impedance which is greater than the acoustic impedance of the piezoceramic 16. One such material is titanium (Ti), Titanium has an acoustic impedance of ~27 MRayls, which is greater than the acoustic impedance of the piezoceramic, and can be made very thin, i.e. a thickness (t) of 0.060 inches (t=0.060"), such as is suitable for use in the present pulse-echo acoustic transducer 10. Other materials and thicknesses may be used such as stainless steel, which has an acoustic impedance of ~45 MRayls may also be used.

Still further in the housing and situated over a face of the first protection layer 18 opposite the piezoceramic 16, is a second protection layer 20 for the piezoceramic. The second protection layer 20 is formed of a small thickness material that resists abrasion and has an acoustic impedance which is less than the acoustic impedance of the first protection layer 18. Preferably, but not necessarily, the second protection layer 20 has an acoustic impedance that is less than the acoustic impedance of the piezoceramic 16. Once such material is a polymer and particularly a polymer known as PEEK (polyetheretherketone). PEEK has an acoustic impedance of ~4.5 MRayls, which is less than the acoustic impedance of both the first protection layer 18 and the piezoceramic 16, and can be made very thin, i.e. thicknesses (t) of between 0.040 inches (t=0.040") and 0.060 inches (t=0.060"), such as is suitable for use in the present pulse-echo acoustic transducer 10. Other materials and thicknesses may be used.

It should be appreciated that the components of the pulse-echo acoustic transducer 10 shown in FIG. 1 are not drawn to scale, both with respect to the overall pulse-echo transducer and to each other. Shapes may be changed as desired as long as the present principles are followed. In the embodiment shown in FIG. 1, the second protection layer 20 may be considered an outer protection layer while the first protection layer 18 may be considered an inner or intermediate protection layer. The outer protection layer 20 is shown as separate from the housing 12. It should be appreciated, however, that the outer protection layer 20 may be integral with or part of the housing 12. This configuration is shown in the pulse-echo acoustic transducer 10a of FIG. 2.

Figure 2:
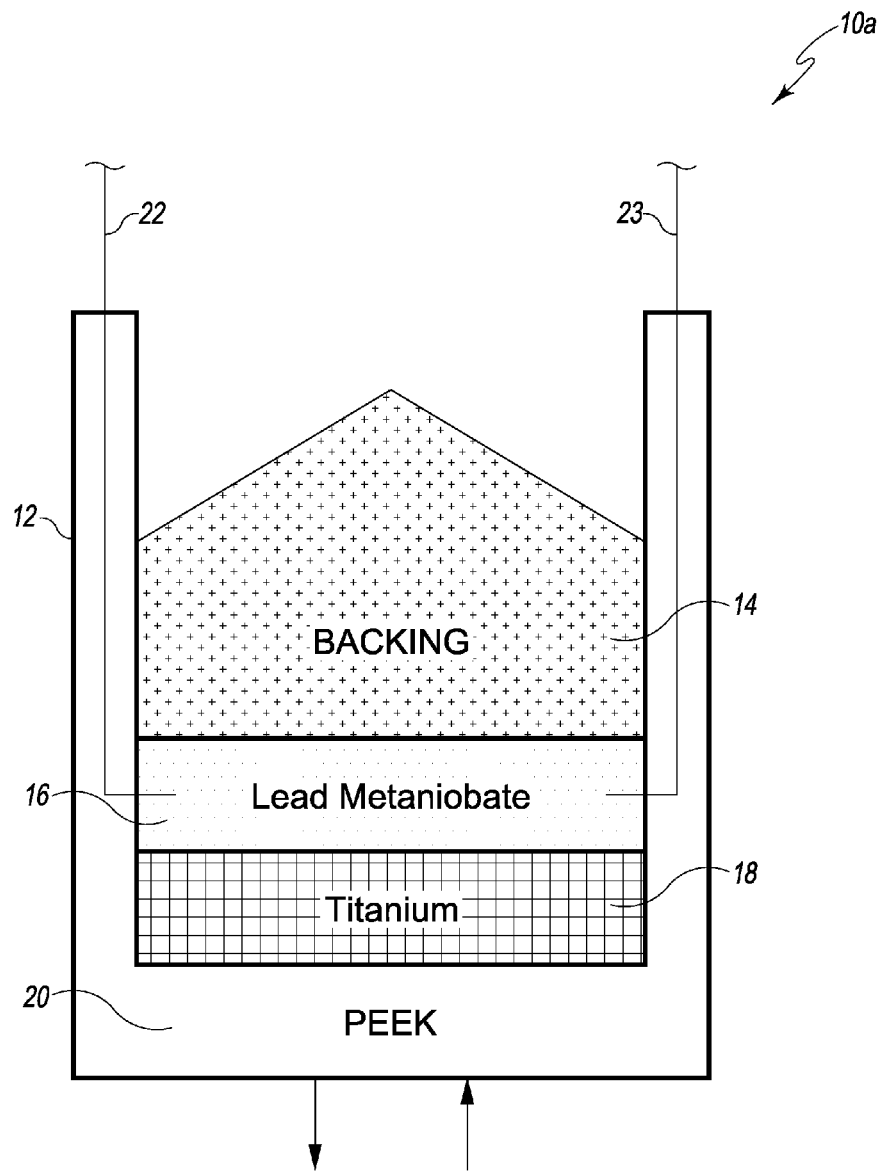
FIG. 2 is an illustration of an embodiment of the pulse-echo acoustic transducer generally shown in FIG. 1, the pulse-echo acoustic transducer shown emitting an acoustic signal (pulse) and receiving a reflected acoustic signal (echo)

Referring now to FIG. 2, a specific pulse-echo acoustic transducer embodiment 10a of the pulse-echo acoustic transducer 10 of FIG. 1 is shown. With other aspects being the same as described above for the pulse-echo acoustic transducer 10 of FIG. 1, the pulse-echo acoustic transducer 10a is shown having a lead metaniobate piezoelectric element (piezoceramic) 16 and a titanium protection layer (first, inner or intermediate layer) 18 adjacent to the piezoelectric element 16. In this embodiment the outer or second protection layer 20 is formed as part of a PEEK housing 12.

It should be appreciated that the components of the pulse-echo acoustic transducer 10a shown in FIG. 2 are not drawn to scale, both with respect to the overall pulse-echo transducer and to each other, Shapes may be changed as desired as long as the present principles are followed. Moreover, and as additionally applicable to the pulse-echo acoustic transducer 10 of FIG. 1, the pulse-echo acoustic transducer 10a may have three or more protection layers rather than two as shown as long as acoustic in relationships as described herein are maintained. For example, a third protection layer (not shown) would be positioned between the outer protection layer and the piezoceramic.

Figure 3:
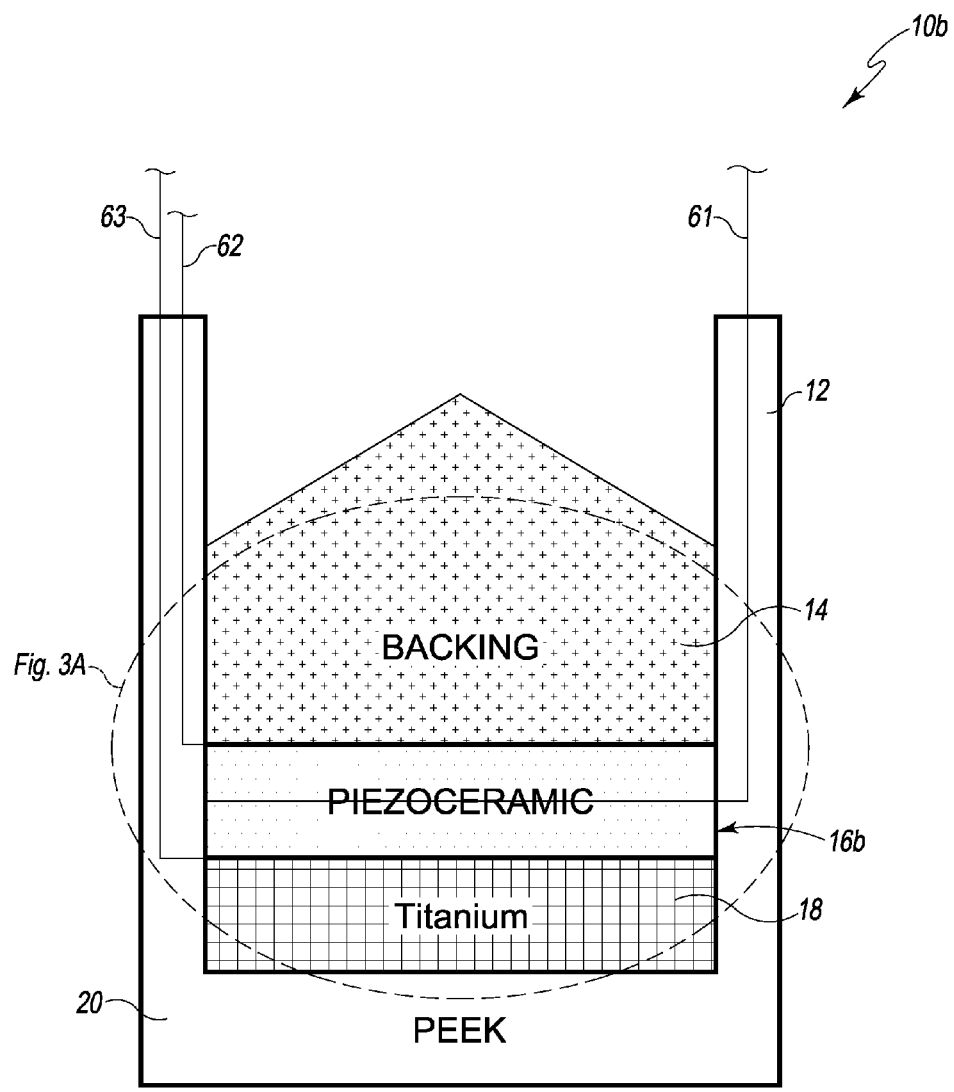
FIG. 3 is an illustration of another embodiment of the pulse-echo acoustic transducer generally shown in FIG. 1.

Referring now to FIG. 3, another specific pulse-echo acoustic transducer embodiment 10b of the pulse-echo acoustic transducer 10 of FIG. 1 is shown. With other aspects being the same as described above for the pulse-echo acoustic transducer 10 of FIG. 1, the pulse-echo acoustic transducer 10b is shown having a two-piece lead metaniobate piezoelectric element (piezoceramic) 10b and a titanium protection layer (first, inner or intermediate layer) 18 adjacent to the two-piece piezoelectric element 16b. In this embodiment the outer or second protection layer 20 is formed as part of a PEEK housing 12.

Figure 3A:
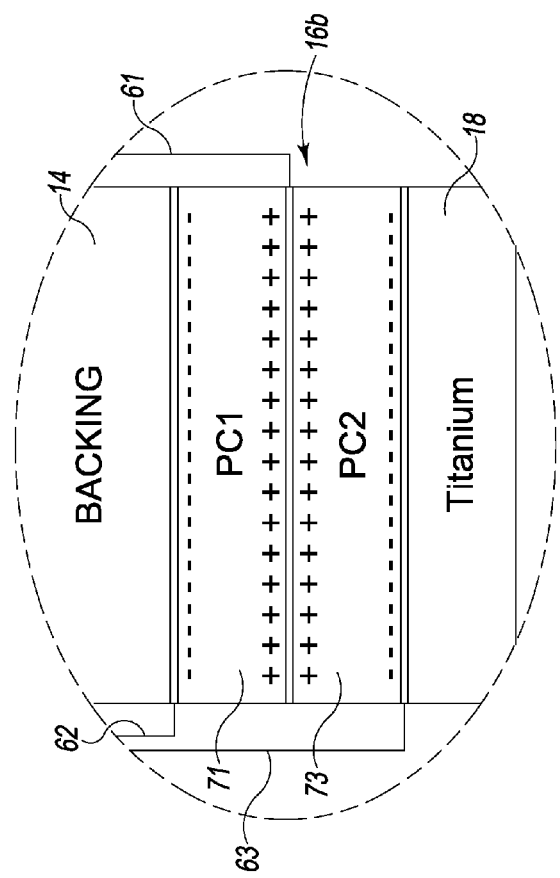
FIG. 3A is an enlarged portion of the pulse-echo acoustic transducer of FIG. 3 taken along circle 3A-3A of FIG. 3, the enlargement showing electrical connection of the two-element piezoceramic thereof.

As discerned more clearly in FIG. 3A, the two-piece piezoceramic element 16b is characterized by a first piezoceramic PC1 and a second piezoceramic PC2. The first and second piezoceramics PC1, PC2 are preferably, but not necessarily, bonded to one another by a suitable bonding agent such as is known in the art. An electrical lead 61 is connected to positive (ground) of a voltage source (not shown), while electrical leads 62 and 63 are both connected to negative of the voltage source (not shown). The electrical lead 61 is electrically connected to a front face of the first piezoceramic PC1 and to a rear face of the second piezoceramic PC2. The electrical lead 62 is electrically connected to the rear face of the first piezoceramic PC1, while the electrical lead 63 is electrically connected to the front face of the second piezoceramic PC2. Through this manner of connecting the piezoceramic element 10b, the piezoceramic element 16b may be driven by energizing both piezoceramics PC1, PC2 at the same time, separately with or without a delay between energizing the first piezoceramic PC1 and the second piezoceramic PC2, or just one or the other of the two piezoceramics PC1, PC2. Various open characteristics can be achieved by these manners of driving the piezoceramic element 16b. For instance, using two piezoceramics rather than a single piezoceramic, with a central positive electrode and two negative electrodes, provides a doubling of the signal and cuts the return signal (echo) voltage by ½. Also, by having a central grounded electrode, the two piezoceramic element 16b reduces parasitic capacitance, which can be a noise source.

It should again be appreciated that the components of the pulse-echo acoustic transducer 10b shown in FIG. 3 are not drawn to scale, both with respect to the overall pulse-echo transducer and to each other. Shapes may be changed as desired as long as the present principles are followed. Moreover, and as additionally applicable to the pulse-echo acoustic transducer 10 of FIG. 1, the pulse-echo acoustic transducer 10b may have three or more protection layers rather than two as shown as long as acoustic impedance relationships as described herein are maintained. For example, a third protection layer (not shown) would be positioned between the outer protection layer and the piezoceramic.

As indicated above, the size of the piezoceramic and protection layers as depicted in the figures is not to scale. For a real-world and given application, the thickness of the piezoceramic depends on the desired operating frequency of the piezoceramic or transducer. A thin wafer element generally vibrates with a wavelength twice its thickness. Therefore, the piezoceramic may be cut to a thickness that is ½ the desired radiated wavelength. The higher the frequency of the transducer, the thinner the active element. The thickness of the protection layers is selected according to the radiated wavelength. While a rule of thumb for thickness of a protection layer is one-quarter (¼) of the radiated wavelength in order to accommodate impedance matching, it has been found that a one-eighth (⅛) wavelength or less of the radiated wavelength thickness of a protection layer is desired. This is particularly true for the outer protection layer. Moreover, it may be desirable for the intermediate protection layer or layers to have a thickness of less than one eighth of the radiated wavelength (⅛λ) or there is a significant drop of sensitivity and bandwidth. It has also been determined that a titanium protection layer of one fourteenth of the radiated wavelength (1/14λ) along with the ⅛λ, thickness of the PEEK front protection layer provides improved sensitivity and bandwidth. Of course, other thicknesses may be used within the present principles. In one representative embodiment for a 500 kHz piezoceramic, the piezoceramic is 0.122" thick, a titanium protection layer is 0.060" thick, and a second protection layer (which may be a PEEK housing) may be between 0.040 and 0.050" thick. In another representative embodiment for a 200 kHz piezoceramic, the piezoceramic is 0.244" thick (preferably, but not necessarily, by stacking two 500 kHz, 0.122" thick piezoceramics), a titanium protection layer is 0.060" thick, and a second protection layer (which may be a PEEK housing) may be between 0.040 and 0.050" thick.

Using the above principles, response of the present pulse-echo acoustic transducer is optimized by exhibiting greater output signal (pulse) bandwidth and increased return signal (echo) sensitivity. The inventors have shown such optimization is exhibited through testing of various pulse-echo acoustic transducer configurations, the results of which are presented in the graphs of FIGS. 4-6.

Figure 4:
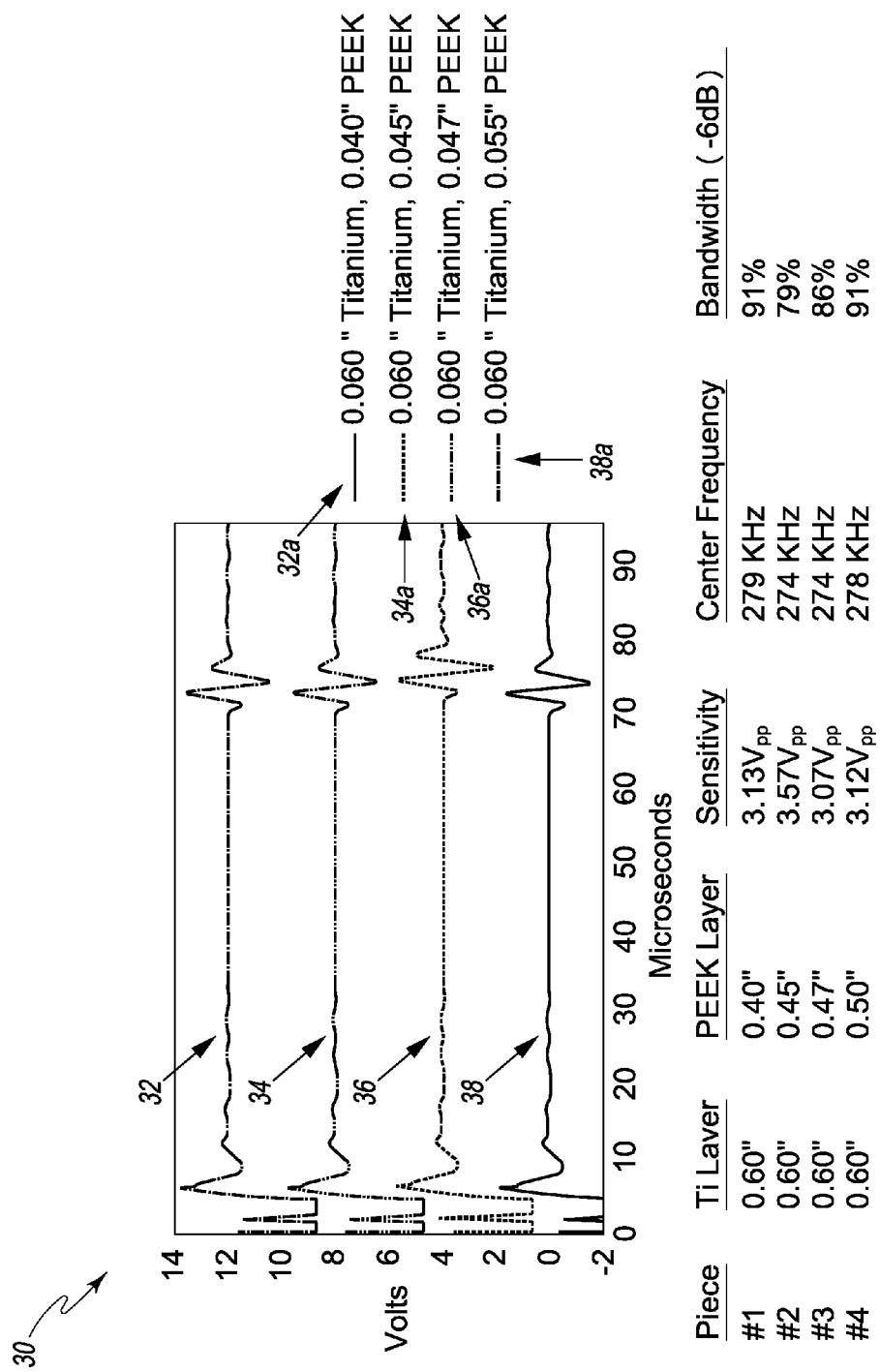
FIG. 4 is a graph showing four pulse-echo acoustic signals as measured for four different thicknesses (t) of the outer protection layer (PEEK Layer) of the pulse-echo acoustic transducer of FIGS. 1-3.

Referring to FIG. 4, there is depicted a graph 30 of four pulse-echo acoustic signals 32, 34, 36, 38 resulting from four pulse-echo acoustic transducers (not shown). The four pulse-echo acoustic transducers each have a 0.060 inch titanium first protection layer, but have a 0.040 inch, a 0.045 inch, a 0.047 inch, and a 0.055 inch PEEK outer protection layer respectively, as represented by lines 32a, 34a, 36a, 38a respectively.

It can be seen that the sensitivity, center frequency and bandwidth of the present pulse-echo acoustic transducer are all fairly constant over the thickness variations in the outer protection layer. Moreover, the bandwidth of the signals range between 79 to 91%. An initial sharp pulse without ringing provides a large bandwidth signal that produces an echo with less ring while maintaining sensitivity.

Figure 5:
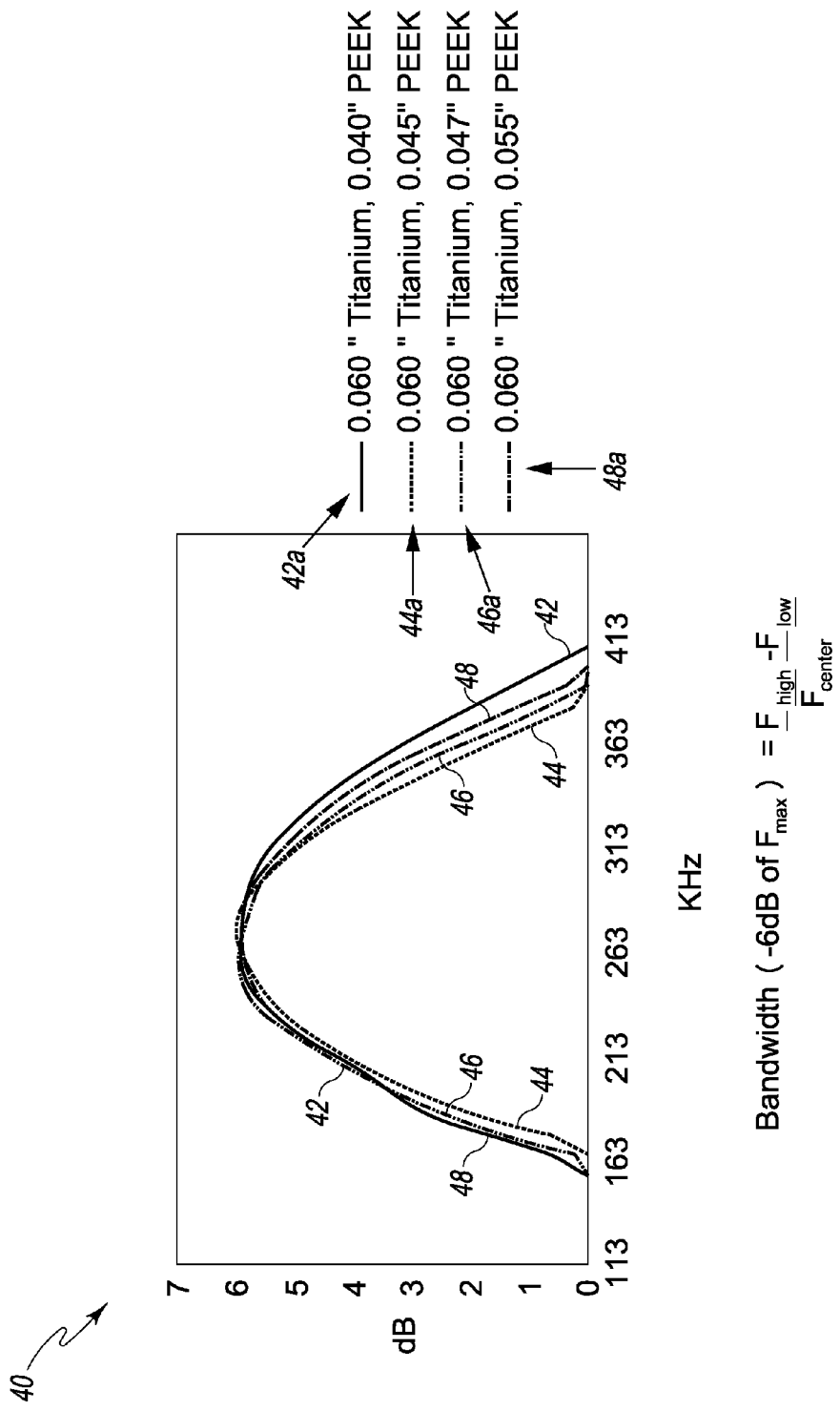
FIG. 5 is a graph showing the bandwidth of the four pulse-echo acoustic signals of the graph of FIG. 4.

Referring to FIG. 5, there is depicted a graph 40 of bandwidth (as calculated using the formula of the graph 40) of four signals/Transducers 42, 44, 46, 48 resulting from the 0.040 inch, 0.045 inch, 0.047 inch, and 0.055 inch PEEK outer protection layer pulse-echo acoustic transducer as represented by lines 42a, 44a, 46a, 48a respectively. Thus, when a transducer with a PEEK face is used in an abrasive environment, causing the PEEK face to wear over time, the transducer still provides a consistent bandwidth.

Figure 6:
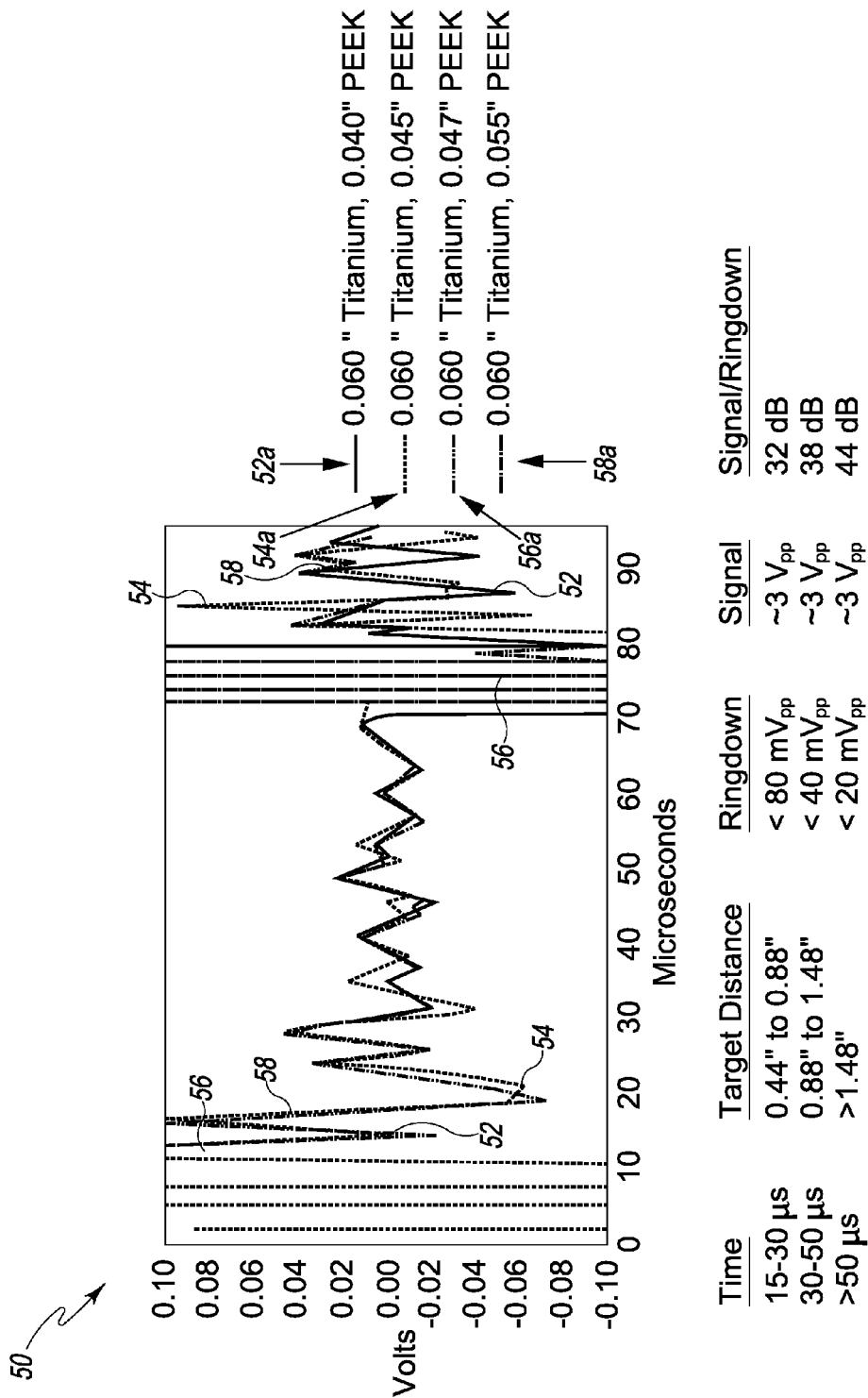
FIG. 6 is a graph showing four pulse-echo acoustic signals for the four different PEEK layers illustrating their signal to noise ratio.

Referring to FIG. 6, there is depicted a graph 50 of four overlaid signals 52, 54, 56, 58 resulting from the 0.040 inch, 0.045 inch, 0.047 inch, and 0.055 inch PEEK outer protection layer pulse-echo acoustic transducer as represented by lines 52a, 54a, 56a, 58a respectively. It can be seen that the ring-down for both the initial pulse and the echo is minimal for all four signals while maintaining echo sensitivity.

Figure 7:
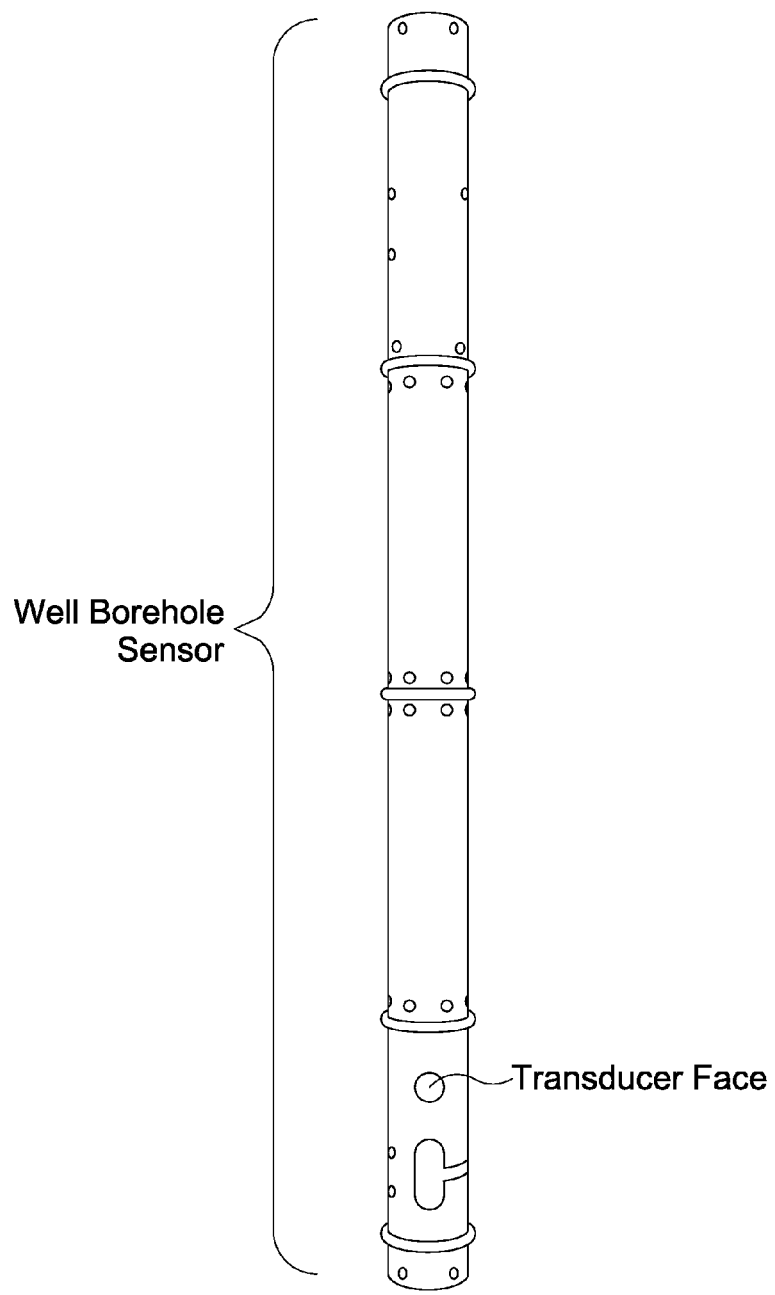
FIG. 7 is an illustration of an exemplary device suitable for positioning in a well and into which a pulse-echo acoustic transducer of the present invention on may be contained.

Referring to FIG. 7, there is depicted a representative sensor for characterizing oil wells. The device is sized to be able to be lowered into a well. The device includes a transducer as described above, and the face of the transducer comprises part of the outer surface of the device. At any point in the well, the transducer may be fired to generate an acoustic wave and receive the echo there from. In addition, the device may be rotated as it is lowered, or raised from the well, and may continuously take readings from the transducer to generate a 3-D characterization of the well.

While the present system has been described with reference to well measurement/analysis, the present pulse-echo acoustic transducer can be used for non-destructive testing and/or analysis of other structures, assemblies, formations, items and or things.

Those of skill in the art will understand that various details of the invention may be changed without departing from the spirit and scope of the invention. Furthermore, the foregoing description is for illustration only, and not for the purpose of limitation, the invention being defined by the claims.

While the invention has been illustrated and described in detail in the foregoing drawings and description, the same is to be considered as illustrative and not restrictive in character, it being understood that only an illustrative embodiment thereof has been show and described and that all changes and modifications that are within the scope of the following claims are desired to be protected.

Any and all references cited in this specification are incorporated herein by reference to the extent that they supplement, explain, provide a background for or teach methodology or techniques employed herein.

What is claimed is:

1. An acoustic transducer, the acoustic transducer characterized by a backing, a piezoceramic situated adjacent the backing, an intermediate protection layer situated adjacent the piezoceramic, and a front protection layer situated adjacent the intermediate protection layer and opposite the piezoceramic, the improvement comprising:
the intermediate protection layer having an acoustic impedance higher than the acoustic impedances of the piezoceramic and of the front protection layer.

2. The acoustic transducer of claim 1, wherein the acoustic impedance of the front protection layer is lower than the acoustic impedance of the piezoceramic.

3. The acoustic transducer of claim 2, wherein:
the front protection layer comprises PEEK; and
the intermediate protection layer comprises titanium.

4. The acoustic transducer of claim 3, wherein the piezoceramic comprises lead metaniobate.

5. The acoustic transducer of claim 4, wherein the lead metaniobate piezoceramic comprises first and second lead metaniobate pieces bonded together.

6. The acoustic transducer of claim 3, wherein the PEEK comprises a 30% glass fiber PEEK.

7. An acoustic transducer comprising:
a housing;
a backing disposed in the housing;
a piezoceramic disposed in the housing adjacent the backing;
a first protection layer disposed in the housing adjacent the piezoceramic; and
a second protection layer disposed in the housing adjacent the first protection layer opposite the first protection layer;
the first protection layer having an acoustic impedance that is higher than acoustic impedances of the piezoceramic and the second protection layer.

8. The acoustic transducer of claim 7, wherein the acoustic impedance of the second protection is lower than the acoustic impedance of the piezoceramic.

9. The acoustic transducer of claim 8, wherein the second protection layer is made of PEEK, and the first protection layer is made of titanium.

10. The acoustic transducer of claim 9, wherein the PEEK comprises a 30% glass fiber PEEK.

11. The acoustic transducer of claim 9, wherein the piezoceramic comprises lead metaniobate.

12. The acoustic transducer of claim 11, wherein the lead metaniobate piezoceramic comprises first and second lead metaniobate pieces bonded together.

13. The acoustic transducer of claim 7, further comprising a housing configured to be inserted into a well, the housing having an outer surface; and wherein:
the acoustic transducer housing has a face, and
the face comprises a part of the outer surface of the housing.

* * * * *